(12) United States Patent
Choi et al.

(10) Patent No.: US 7,911,248 B2
(45) Date of Patent: Mar. 22, 2011

(54) APPARATUS FOR LINEARIZATION OF DIGITALLY CONTROLLED OSCILLATOR

(75) Inventors: Jang Hong Choi, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/629,701

(22) Filed: Dec. 2, 2009

(65) Prior Publication Data

US 2010/0141315 A1 Jun. 10, 2010

(30) Foreign Application Priority Data

Dec. 4, 2008 (KR) ................... 10-2008-0122269
Jun. 22, 2009 (KR) ................... 10-2009-0055583

(51) Int. Cl.
*H03L 7/06* (2006.01)
(52) U.S. Cl. ........................ 327/159; 331/1 R
(58) Field of Classification Search ............ None
See application file for complete search history.

(56) References Cited

U.S. PATENT DOCUMENTS

| | | | |
|---|---|---|---|
| 4,712,223 A * | 12/1987 | Nelson | 377/43 |
| 6,768,385 B2 * | 7/2004 | Smith | 331/1 A |
| 7,230,785 B2 * | 6/2007 | Itagaki et al. | 360/73.03 |
| 7,420,426 B2 * | 9/2008 | Herrin et al. | 331/1 A |
| 2002/0094052 A1 | 7/2002 | Staszewski et al. | |
| 2004/0066240 A1 | 4/2004 | Staszewski et al. | |
| 2007/0124354 A1 | 5/2007 | Lee et al. | |
| 2008/0094147 A1 | 4/2008 | Olsson et al. | |
| 2008/0253492 A1 * | 10/2008 | Wang et al. | 375/376 |

OTHER PUBLICATIONS

Robert B. Staszewski et al., "Just-In-Time Gain Estimation of an RF Digitally-Controlled Oscillator," CICC(IEEE 2003 Custom Integrated Circuits Conference), Feb. 2003, pp. 571-574, vol. 25, No. 8.

* cited by examiner

*Primary Examiner* — Cassandra Cox (57) ABSTRACT

There is provided an apparatus for the linearization of a digitally controlled oscillator. The apparatus includes a first filter outputting only a low frequency band signal of an input signal to the digitally controlled oscillator; a negative feedback loop causing the signal of an input port of the digitally controlled oscillator to pass through a frequency table and a frequency-to-digital code mapper in sequence and correcting an input of the digitally controlled oscillator by performing negative feedback to an input port of the first filter; and a frequency table generator storing a frequency value of an output signal of the digitally controlled oscillator in the frequency table.

10 Claims, 6 Drawing Sheets

APPARATUS FOR LINEARIZATION OF DIGITALLY CONTROLLED OSCILLATOR

CROSS-REFERENCE TO RELATED APPLICATIONS

This application claims the priorities of Korean Patent Application Nos. 10-2008-0122269 filed on Dec. 4, 2008 and 10-2009-0055583 filed on Jun. 22, 2009, in the Korean Intellectual Property Office, the disclosures of which are incorporated herein by reference.

BACKGROUND OF THE INVENTION

1. Field of the Invention

The present invention relates to an apparatus for the linearization of a digitally controlled oscillator (DCO), and more particularly, to an apparatus for the linearization of a DCO enabling the achievement of linearity within the entirety of the DCO by correcting an input directly applied to the DCO with the addition of a negative feedback loop, including a frequency table and a frequency-to-digital code mapper, to an input port of the DCO.

2. Description of the Related Art

Currently, mobile communication terminals need to support multiple modes and multiple bands, and the development period of products has also become shorter, and thus there is a need for a change in a traditional design methodology for a radio frequency (RF) front-end. As the minimum linewidth of a complementary metal-oxide semiconductor (CMOS) process is reduced, the implementation of RF blocks is undergoing a process of change from an existing analog method to a digital method in order that RF signals can be processed in the form of digital or discrete signals.

Figure 1:
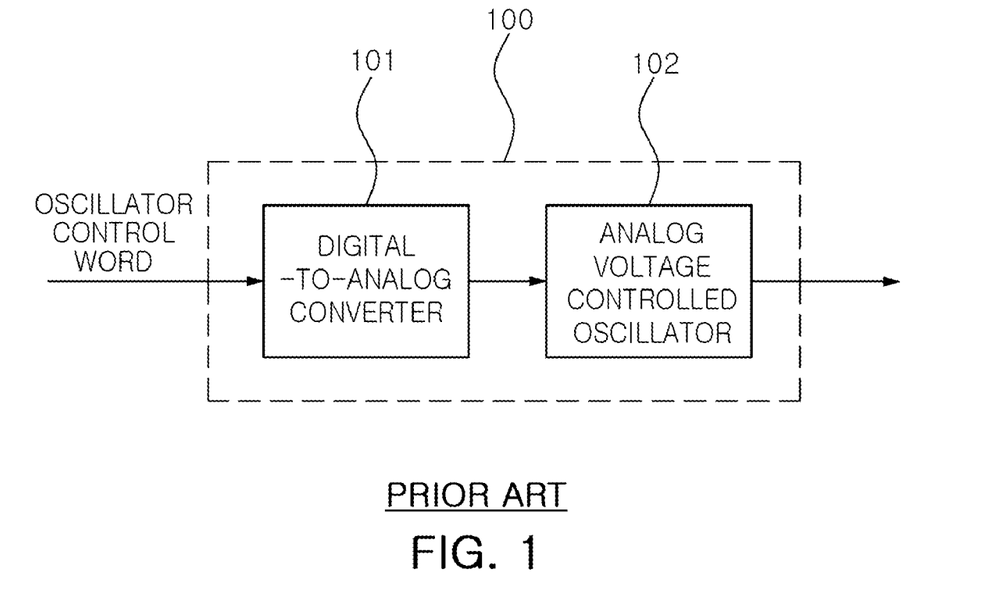
FIG. 1 illustrates a configuration of an existing digitally controlled oscillator (DCO)

FIG. 1 is a block diagram illustrating a general digitally controlled oscillator (DCO).

Referring to FIG. 1, a DCO 100 includes a digital-to-analog converter (DAC) 101 and an analog voltage controlled oscillator (VCO) 102.

The DAC 101 converts a digital input value of an oscillator control word into an analog voltage form and outputs the converted voltage to the analog VCO 102. The analog VCO 102 receives the output voltage of the DAC 101 and outputs a continuous signal having an oscillation frequency corresponding to that voltage.

A DCO, which is a core block of a digital frequency synthesizer, receives an input of an oscillator control word and outputs a continuous signal having an output frequency corresponding to that oscillator control word. However, due to external environments such as process variation, voltage, and temperature, it is impossible to output an exact frequency corresponding to the oscillator control word without a tuning process.

A code gain of the DCO is defined as a variation in the output frequency of the DCO with respect to a variation in a Least Significant Bit (LSB) of the oscillator control word. In general, the code gain of the DCO is not consistent in an entirety of an oscillator control word area. When the code gain is not consistent, the characteristics of the digital frequency synthesizer may be variable according to each oscillator control word, so variations in performance may be undesirably large.

Also, when the digital frequency synthesizer is generally designed, other blocks are designed with an assumption that the code gain is consistent, so it may be desirable to make the code gain consistent. Particularly, when a transmitter is designed by using a direct modulation method, the code gain of the DCO is required to be consistent. This is because when the code gain is not consistent, distortion of transmitted data may occur.

SUMMARY OF THE INVENTION

An aspect of the present invention provides an apparatus for the linearization of a digitally controlled oscillator (DCO) enabling the achievement of linearity within the entirety of the DCO by correcting an input directly applied to the DCO with the addition of a negative feedback loop, including a digital loop filter, a frequency table and a frequency-to-digital code mapper, to an input port of a DCO having non-linearity.

According to an aspect of the present invention, there is provided an apparatus for linearization of a digitally controlled oscillator, the apparatus including: a first filter outputting only a low frequency band signal of an input signal to the digitally controlled oscillator; a negative feedback loop causing the signal of an input port of the digitally controlled oscillator to pass through a frequency table and a frequency-to-digital code mapper in sequence and correcting an input of the digitally controlled oscillator by performing negative feedback to an input port of the first filter; and a frequency table generator storing a frequency value of an output signal of the digitally controlled oscillator in the frequency table.

The negative feedback loop may include the frequency table storing a frequency value of an output signal of the digitally controlled oscillator corresponding to each digital code input by using digital codes as address values, and the frequency-to-digital code mapper outputting a digital code corresponding to an output frequency value of the frequency table by using the output frequency value of the frequency table as an input.

The address values of the frequency table may be a $2^M$ number of digital codes corresponding to decimal numbers from zero to $2^M-1$, respectively.

The frequency-to-digital code mapper may determine and output a digital code corresponding to a frequency value according to a preset standard.

The frequency table generator may include an M-bit counter generating a $2^M$ number of digital codes in sequence from zero and providing the generated codes to the digitally controlled oscillator and the frequency table as an input and an address value with which to store a frequency, respectively; a frequency meter measuring frequency values of output signals of the digitally controlled oscillator and outputting the measured frequency values to a second filter; and the second filter receiving an output of the frequency meter, averaging the received frequency values, and outputting the averaged frequency values to the frequency table. The frequency table may store a frequency value corresponding to each address value provided by the M-bit counter.

The second filter may be a digital low pass filter allowing only a low frequency band signal to pass therethrough.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. However, detailed descriptions related to well-known functions or configurations will be ruled out in order not to unnecessarily obscure subject matters of the present invention. Throughout the drawings, the same reference numerals will be used to designate the same or like parts.

In addition, throughout the specification, it will be understood that when an element is referred to as being "connected to" another element, it can be both directly connected to the other element or intervening elements may be present. Also, unless explicitly described to the contrary, the word "include" and variations such as "includes" or "including," will be understood to imply the inclusion of stated elements but not the exclusion of any other elements.

Figure 2:
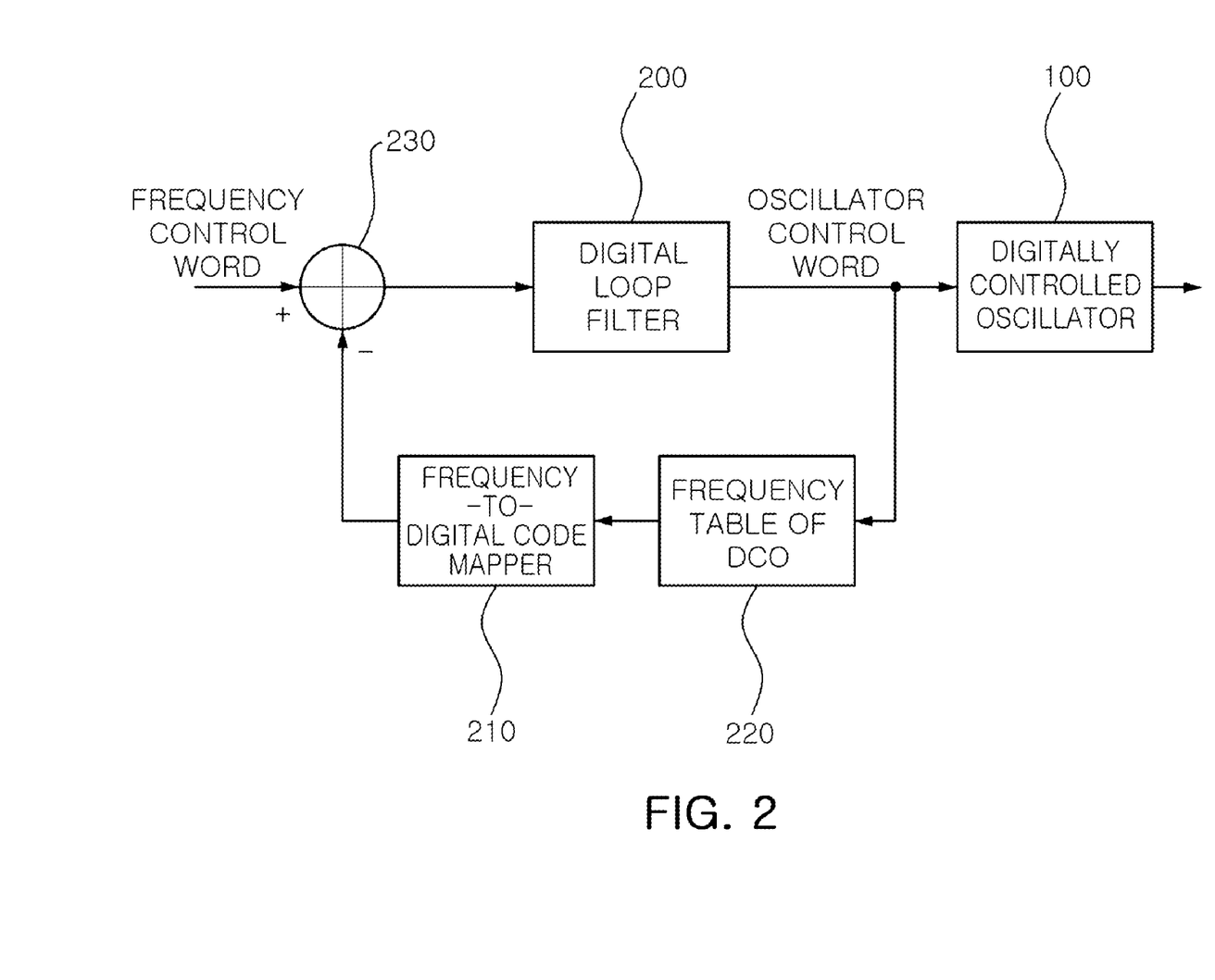
FIG. 2 illustrates an apparatus for the linearization of a DCO using a negative feedback loop according to an exemplary embodiment of the present invention.

FIG. 2 illustrates an apparatus for the linearization of a digitally controlled oscillator (DCO) according to an exemplary embodiment of the present invention.

Referring to FIG. 2, the apparatus for the linearization of the DCO according to this embodiment includes a subtracter 230, a digital loop filter 200, a frequency table 220, a frequency-to-digital code mapper 210, and a DCO 100.

The subtracter 230, the frequency table 220, and the frequency-to-digital code mapper 210 form a negative feedback loop.

When a loop gain of a negative feedback circuit is considerably larger than one and the negative feedback loop is stable, a frequency control word and an output digital code value of the frequency-to-digital code mapper 210 become equal due to negative feedback mechanism.

The frequency-to-digital code mapper 210 implements mapping in a manner that converts a frequency value into a corresponding digital code according to a preset standard, so it has linearity. Therefore, an input frequency value of the frequency-to-digital code mapper 210, i.e., an output frequency value of the frequency table 220 may become an exact frequency value corresponding to the frequency control word.

Meanwhile, since the frequency table 220 stores a frequency value of an output signal of the DCO 100 corresponding to each input, it has the same input/output transfer function as the DCO 100. Accordingly, the frequency value of the output signal of the DCO 100 is equal to the output frequency value of the frequency table 220. Also, as described above, since the output frequency value of the frequency table 220 is the exact frequency value corresponding to the frequency control word, the frequency value of the output signal of the DCO 100 becomes the exact frequency value corresponding to the frequency control word.

That is, when a frequency control word is applied as an input to the apparatus according to this embodiment, an oscillator control word, applied as a direct input to the DCO 100, is corrected in order that the frequency value of an output signal of the DCO 100 becomes equal to the exact frequency value corresponding to the frequency control word due to the negative feedback mechanism.

Figure 3:
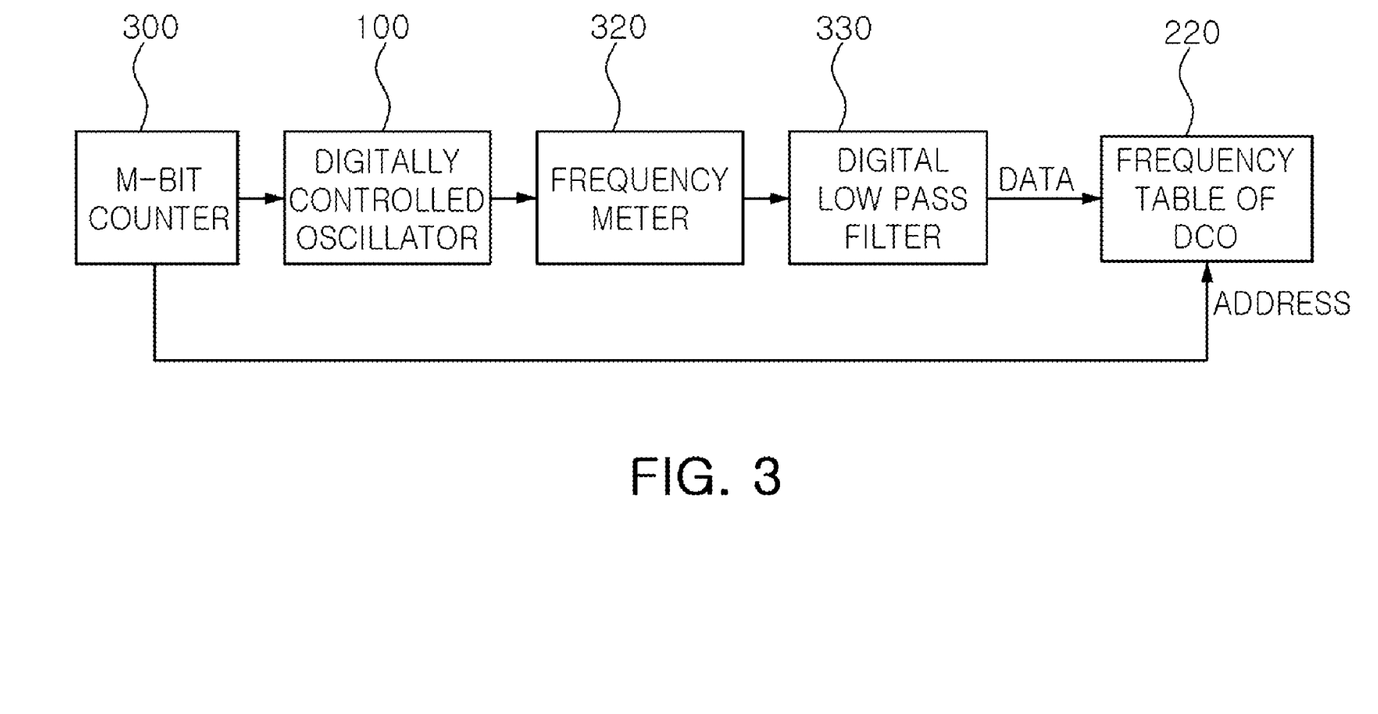
FIG. 3 illustrates a configuration of an apparatus for storing the frequency values of output signals of a DCO in a frequency table of the DCO.

FIG. 3 illustrates a frequency table generator storing the frequency values of output signals of the DCO 100 in the frequency table 220.

Referring to FIG. 3, an apparatus for storing the frequency values of output signals of the DCO 100 in the frequency table 220 includes an M-bit counter 300, a frequency meter 320, a digital low pass filter 330, and the frequency table 220.

The M-bit counter 300 generates a $2^M$ number of digital codes in the range of zero to $2^M-1$ and provides them as an input to the DCO 100 and as an address value to the frequency table 220.

The DCO 100 receives an output of the M-bit counter 300 and outputs a signal having a specific frequency. At this time, due to non-linearity of the DCO 100, the frequency value of the output signal has a slight error, as compared to an exact frequency value which is applied as an input.

The frequency meter 320 measures the frequency values of output signals of the DCO 100, and the digital low pass filter 330 averages the measured frequency values. And the frequency table 220 stores the averaged frequency values according to address.

Therefore, when a cycle of the M-bit counter 300 is completed, the frequency values of output signals of the DCO 100 corresponding to all possible input are stored as corresponding address values of the frequency table 220, respectively.

Figure 4:
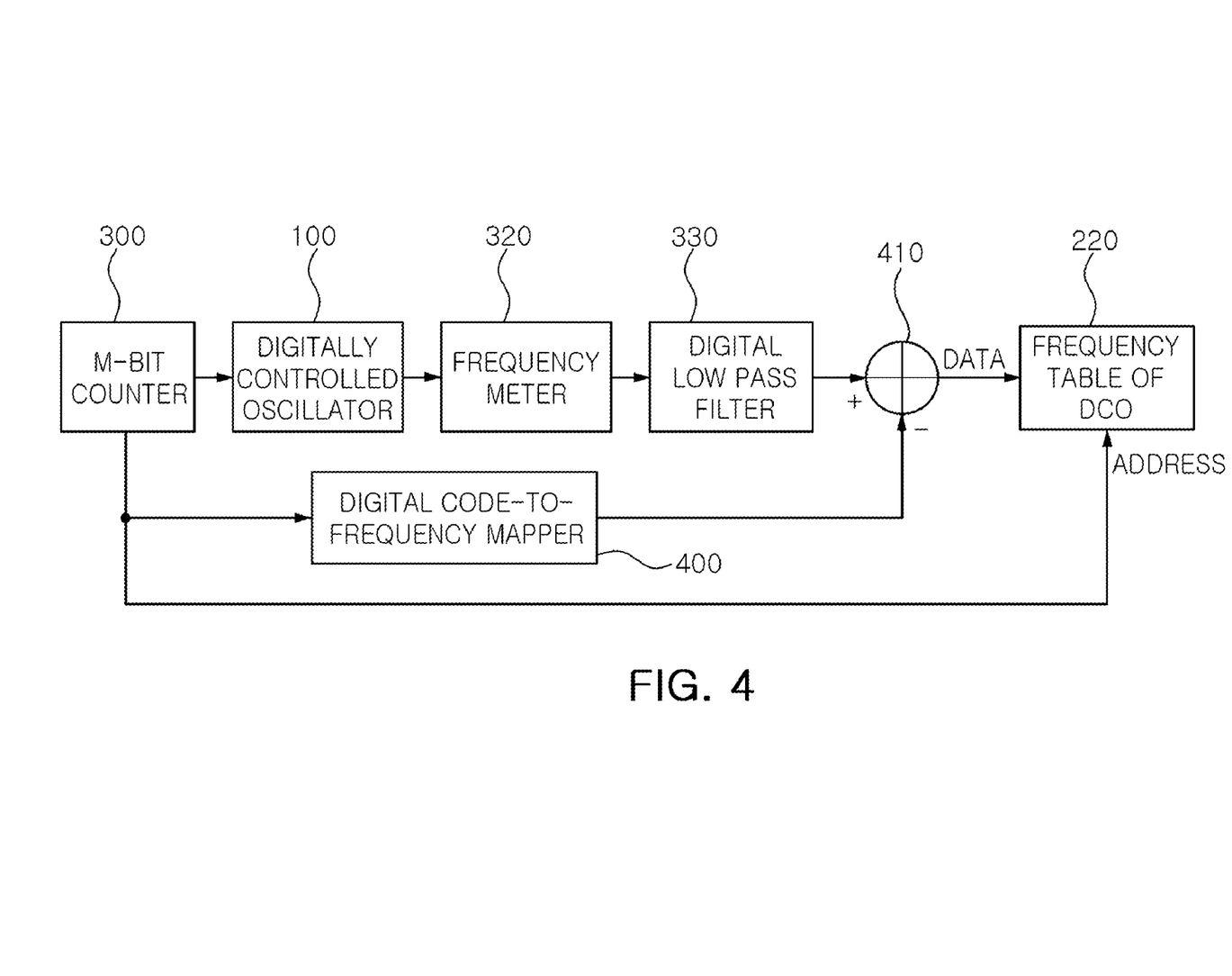
FIG. 4 illustrates a configuration of an apparatus for storing errors, which the frequency values of output signals of a DCO have, in a frequency table of the DCO.

FIG. 4 illustrates a frequency table generator storing only errors, which the frequency values of output signals of the DCO 100 have, in the frequency table 220.

As compared to the frequency table generator of FIG. 3, the frequency table generator of FIG. 4 further includes a digital code-to-frequency mapper 400 outputting frequency values corresponding to output digital codes of the M-bit counter 300, and a subtracter 410 outputting a difference between an output of the digital low pass filter 330 and an output of the digital code-to-frequency mapper 400.

The digital code-to-frequency mapper 400 simply converts a digital code into a frequency, so it has linearity. Accordingly, its output is an exact frequency value corresponding to an input digital code.

The subtracter 410 outputs a value subtracting the output of the digital code-to-frequency mapper 400 from the output of the digital low pass filter 330. Therefore, the output of the subtracter 410 becomes an error, which the frequency value of an output signal of the DCO 100 has, and this error is stored as a corresponding address value of the frequency table 220.

As described above, by storing only the error rather than the overall frequency value, the disadvantage of the digital hardware growth may be overcome.

Figure 5:
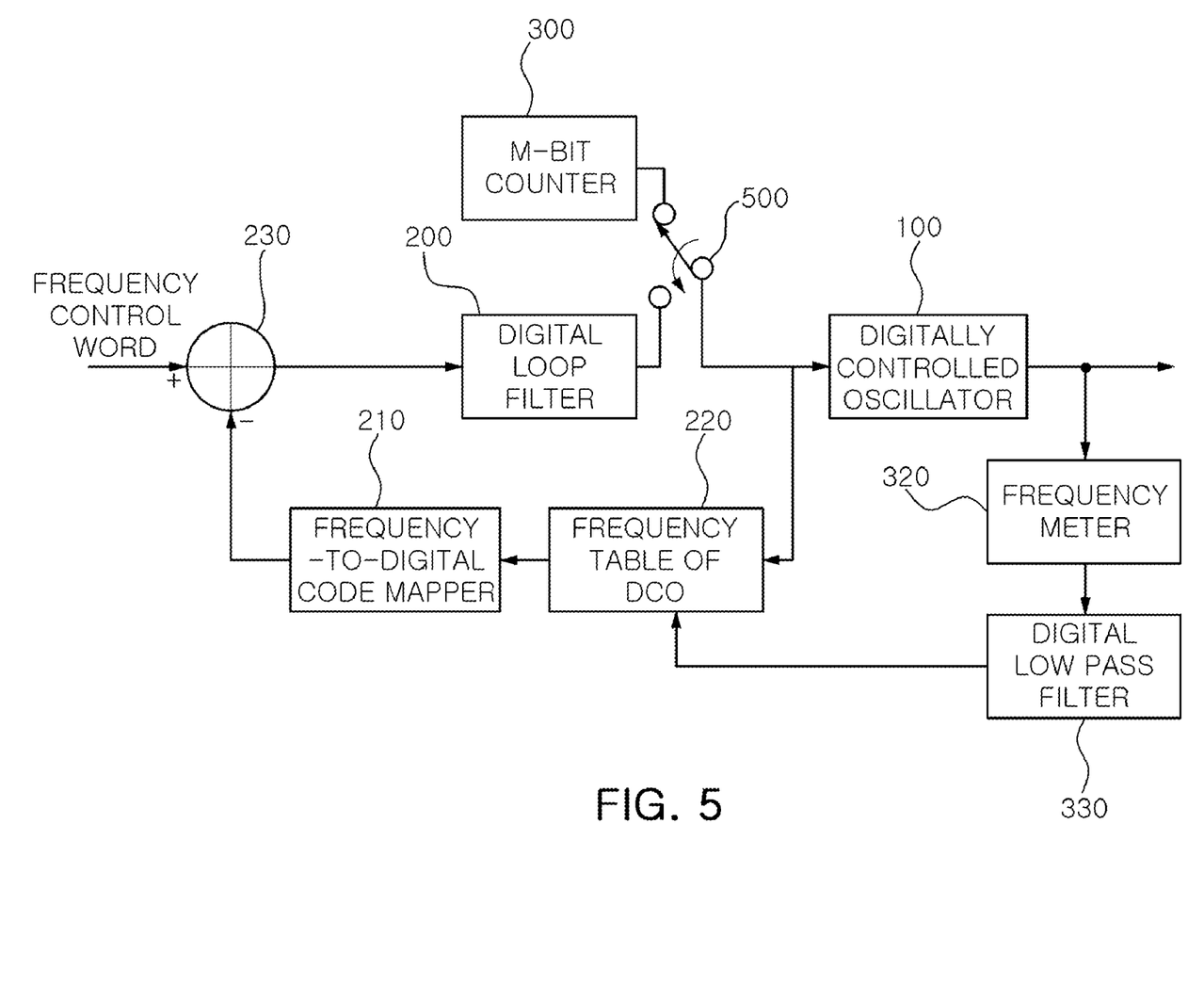
FIG. 5 illustrates a configuration of an apparatus for the linearization of a DCO, including an apparatus for storing the frequency values of output signals of the DCO in a frequency table of the DCO.

FIG. 5 illustrates an apparatus for the linearization of a DCO including a frequency table generator.

Referring to FIG. 5, a switch 500 connects the M-bit counter 300 or the digital loop filter 200 to the DCO 100 according to operation.

When the switch 500 is connected to the M-bit counter 300, the frequency values of output signals of the DCO 100 are stored in the frequency table 220.

Here, the detailed process of storing an output of the DCO 100 corresponding to each input in the frequency table 220 is the same as described above with reference to FIG. 3.

On the other hand, when the switch 500 is connected to the digital loop filter 200, this apparatus acts as a linearized DCO due to the negative feedback mechanism. At this time, the frequency meter 320 and the digital low pass filter 330 become inactive.

Here, the detailed process of correcting an input directly applied to the DCO 100 in order that the DCO 100 has linearity due to the negative feedback mechanism is the same as described above with reference to FIG. 2.

Figure 6:
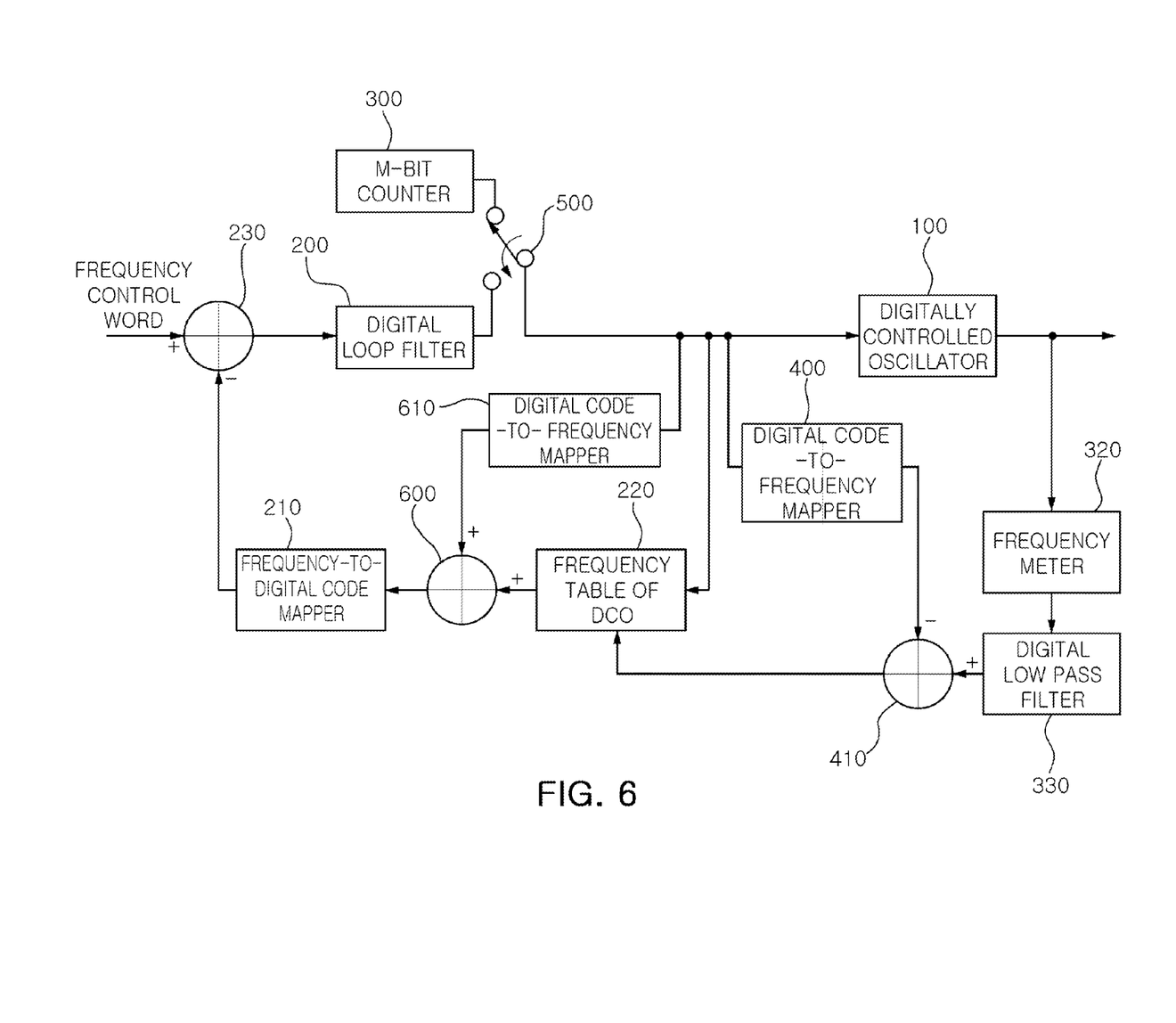
FIG. 6 illustrates a configuration of an apparatus for the linearization of a DCO, including an apparatus for storing errors, which the frequency values of output signals of the DCO have, in a frequency table of the DCO.

FIG. 6 is an apparatus for the linearization of a DCO including an apparatus for storing errors, which the frequency values of output signals of the DCO have, in the frequency table 220.

When the switch 500 is connected to the M-bit counter 300, the errors, which the frequency values of the output signals of the DCO have, are stored in the frequency table 220.

Here, the detailed process of storing the errors, which the frequency values of the output signals of the DCO have, in the frequency table 220 is the same as described above with reference to FIG. 4.

On the other hand, when the switch 500 is connected to the digital loop filter 200, this apparatus acts as a linearized DCO due to the negative feedback mechanism. At this time, the frequency meter 320 and the digital low pass filter 330 become inactive.

Here, a value stored in the frequency table 220 is not the overall frequency value of an output signal corresponding to each input of the DCO 100, but is rather an error relative to an exact frequency value corresponding to each input. Accordingly, as compared to the configuration of FIG. 5, further elements are required.

Specifically, a digital code-to-frequency mapper 610 outputting an exact frequency value corresponding to each input of the DCO 100 and an adder 600 adding an output of the digital code-to-frequency mapper 610 and an output of the frequency table 220 are further included.

Here, the exact frequency value corresponding to the input of the DCO 100 (the output of the digital code-to-frequency mapper 610) and the error which an actual output signal of the DCO 100 has (the output of the frequency table 220) are added by the adder 600, so the frequency value of the actual output signal of the DCO 100 becomes an input of the frequency-to-digital code mapper 210.

Therefore, with a reduction in the use of the hardware capacity of the frequency table 220, the linearization of the DCO may be enabled.

Like this, the apparatus for the linearization of the DCO may be realized by correcting input signals directly applied to the DCO using the negative feedback loop.

As set forth above, according to exemplary embodiments of the invention, the apparatus for the linearization of the DCO is able to cause a DCO having non-linearity to be linearized, so errors in an output of the digital frequency synthesizer may be minimized.

Also, due to the achievement of linearity, the DCO may be applicable to a direct modulation method of a mobile communication transmitter.

While the present invention has been shown and described in connection with the exemplary embodiments, it will be apparent to those skilled in the art that modifications and variations can be made without departing from the spirit and scope of the invention as defined by the appended claims.

What is claimed is:

1. An apparatus for linearization of a digitally controlled oscillator, the apparatus comprising:

a first filter outputting only a low frequency band signal of an input signal to the digitally controlled oscillator;

a negative feedback loop causing the signal of an input port of the digitally controlled oscillator to pass through a frequency table and a frequency-to-digital code mapper in sequence and correcting an input of the digitally controlled oscillator by performing negative feedback to an input port of the first filter; and a frequency table generator storing a frequency value of an output signal of the digitally controlled oscillator in the frequency table.

2. The apparatus of claim 1, wherein the negative feedback loop comprises:

the frequency table storing a frequency value of an output signal of the digitally controlled oscillator corresponding to each digital code input by using digital codes as address values; and the frequency-to-digital code mapper outputting a digital code corresponding to an output frequency value of the frequency table by using the output frequency value of the frequency table as an input.

3. The apparatus of claim 2, wherein the address values of the frequency table are a $2^M$ number of digital codes corresponding to decimal numbers from zero to $2^M-1$, respectively.

4. The apparatus of claim 2, wherein the frequency-to-digital code mapper determines and outputs a digital code corresponding to a frequency value according to a preset standard.

5. The apparatus of claim 1, wherein the frequency table generator comprises:

an M-bit counter generating a $2^M$ number of digital codes in sequence from zero and providing the generated codes to the digitally controlled oscillator and the frequency table as an input and an address value with which to store a frequency, respectively;

a frequency meter measuring frequency values of output signals of the digitally controlled oscillator and outputting the measured frequency values to a second filter; and the second filter receiving an output of the frequency meter, averaging the received frequency values, and outputting the averaged frequency values to the frequency table, wherein the frequency table stores a frequency value corresponding to each address value provided by the M-bit counter.

6. The apparatus of claim 5, wherein the second filter is a digital low pass filter allowing only a low frequency band signal to pass therethrough.

7. The apparatus of claim 5, wherein the frequency table generator further comprising:

a first digital code-to-frequency mapper receiving the signal of the input port of the digitally controlled oscillator and outputting a corresponding frequency value; and an adder adding an output of the first digital code-to-frequency mapper and an output of the frequency table.

8. The apparatus of claim 7, wherein the frequency table generator further comprises:
- a second digital code-to-frequency mapper receiving an output of the M-bit counter and outputting a corresponding frequency value; and
- a subtracter subtracting an output of the second digital code-to-frequency mapper from an output of the second filter and outputting a result value to the frequency table.

9. The apparatus of claim 7, wherein the first and second digital code-to-frequency mappers determine and output a frequency value corresponding to a digital code according to a preset standard.

10. The apparatus of claim 7, wherein the second filter is a digital low pass filter allowing only a low frequency band signal to pass therethrough.

* * * * *